United States Patent [19]

Ozawa

[11] Patent Number: 4,797,571
[45] Date of Patent: Jan. 10, 1989

[54] CONTACT TYPE IMAGE SENSOR
[75] Inventor: Takashi Ozawa, Ebina, Japan
[73] Assignee: Fuji Xerox Co., Ltd., Japan
[21] Appl. No.: 63,779
[22] Filed: Jun. 18, 1987

Related U.S. Application Data
[63] Continuation of Ser. No. 736,690, May 22, 1985.

[30] Foreign Application Priority Data

May 23, 1984 [JP] Japan ................... 59-103997

[51] Int. Cl.⁴ .................. H03K 3/42; H01L 27/02; H01J 40/14
[52] U.S. Cl. .................... 307/311; 357/42; 250/578
[58] Field of Search ............ 307/311; 357/30, 42; 250/578, 736, 690

[56] References Cited
U.S. PATENT DOCUMENTS 3,588,635  6/1971  Medwin ................ 357/42
4,413,188 11/1983  Ozawa et al. ......... 250/578
4,511,804  4/1985  Ozawa ................. 250/578
4,549,088 10/1985  Ozawa ................. 250/578
4,575,638  3/1986  Okumura .............. 250/578

Primary Examiner—Gene M. Munson
Attorney, Agent, or Firm—Handal & Morofsky

[57] ABSTRACT

A contact type image sensor comprises a photoconductive layer sandwiched between a first electrically conductive layer and a plurality of second separate electrodes to form a plurality of light receiving elements comprising a plurality of buffer amplifiers each connected to corresponding one of the plurality of light receiving elements for respectively outputting a voltage whose value corresponds to electric charge stored in the corresponding light receiving elements, switching means for gating the outputs of the buffer amplifiers, and control means for controlling the switching means to lead the outputs of the buffer amplifiers to a signal output line sequentially.

5 Claims, 3 Drawing Sheets

CONTACT TYPE IMAGE SENSOR

This application is a continuation of application Ser. No. 736,690 filed May 22, 1985.

BACKGROUND OF THE INVENTION

1. Field of the Invention

The present invention relates to an improvement in a contact type image sensor for use in an image reading apparatus or the like, and more specifically, to elimination of the effect caused by spike noises generated from a switching circuit included in the image reading apparatus.

2. Description of the Related Art

A contact type image sensor comprises a light receiving array made up of a plurality of light receiving elements and a circuit for performing a scanning over the light receiving element array, and is arranged to read an original manuscript closely disposed to the light receiving element array (whose length corresponds to the width of the original manuscript) or through such an optical system as an optical fiber array or a lens array in a 1:1 image relation. With this type of sensor, the length of the light path can be shorter than that using a MOS image senor or a CCD image sensor. As a result, an apparatus employing contact type image sensor can be remarkably reduced in size.

FIG. 1 is plan view showing a featured part of a contact type image sensor 10 and FIG. 2 is a cross-sectional view taken along line A—A' in FIG. 1. In the illustrated sensor 10, a plurality of electrodes Tl to Tn are formed as spaced by a proper distance therebetween on an insulating substrate 11, a photoconductive thin film 12 is formed on parts of the electrodes Tl to Tn, and then an electrically conductive transparent thin film 13 is formed on the thin film 12. That is, the electrodes Tl to Tn and films 12 and 13 form a laminated layer structure. The electrodes Tl to Tn are connected at the other ends (that is, opposite to the thin films 12 and 13) to a switching circuit 14 through bonding wires Wl to Wn.

The insulating substrate 11 may be made of glass, ceramic, a silicone wafer, or may comprise a metallic plate having insulated surface. The electrodes Tl to Tn may be made of chromium, molybdenum, tungsten, tantalum or nickel. The photoconductive thin layer 12 may be made of amorphous silicon hydride, Se-As-Te, CdS, CdSe and so on. The electrically conductive film 13 may be made of $SnO_2$, $In_2O_5$ or the like. In FIGS. 1 and 2, the areas intersected by the lower electrodes Tl to Tn and the electrically-conductive upper film 13 work as light receiving elements Ll to Ln.

FIG. 3 shows a circuit diagram of the image sensor 10 of FIGS. 1 and 2, in which the light receiving elements Ll to Ln are equivalently expressed by parallel circuits of photodiodes PDl to PDn and capacitors PCl to PCn, respectively. When an image on an original is optically formed on the light receiving elements Ll to Ln, light currents corresponding to the intensity of light received at the associated photodiodes will flow through the photodiodes PDl to PDn respectively. Electric charges corresponding to the magnitudes of the light currents will be stored in the associated capacities Cl to Cn which are respective sums of the stray capacitances of the electrodes Tl to Tn, the junction capacitances between the drain and source of the MOS transistors Sl to Sn, and so on. When the MOS transistors Sl to Sn are sequentially turned ON at intervals of a predetermined constant time under the control of a shift register 15, that is, when the transistors Sl to Sn perform a scanning operation, the charges stored in the respective capacities Cl to Cn will be discharged through a load resistor 17 connected via a signal output line 16 to the capacities Cl to Cn. A current flowing through the load resistor 17 is derived out as a signal indicative of the original document image information. A power source 18 is used to bias the light receiving elements Ll to Ln.

With the contact type image sensor 10, the electric charges stored in the capacities Cl to Cn during the scanning of the MOS transistors Sl to Sn are discharged to use them as an output signal. For this reason, spike noises generated at the time of turning ON the MOS transistors Sl to Sn will appear on the signal output line 16 as noise charges. Assume that the amount of signal charge stored in the capacity Cl is 1 (pC), the gate voltage of the MOS transistor Sl is 5 (V) and the junction capacitance between the gate and source of the transistor is 1 (pF). Then, the amount of noise charge appearing on the signal output line 16 due to the spike noise will be 5 $(pC)$ $(=(pF)\times 5\ (V))$, that is larger than the signal charge (1 (pC)). Further, the time necessary to discharge the signal charge of each of the capacities Cl to Cn is 1 ($\mu$sec) or shorter and thus the current flowing through the resistor 17 is very small. Therefore, the image sensor requires a noise cancellation circuit and a high speed, high gain amplifier. Thus, an apparatus incorporating the contact type image sensor cannot be reduced in size.

Further, since the electrodes Tl to Tn are arranged in parallel with each other on the substrate 1 with a high density, the capacitance between the adjacent electrodes is not negligible. If the width and length of each of the electrodes Tl to Tn are respectively 70 ($\mu$m) and 2 (cm) and the spacing between the adjacent electrodes is 125 ($\mu$m), then the capacitance between the adjacent electrodes will be between 1 and 3 (pF). FIG. 4 is a circuit diagram of a contact type image sensor in which such electrode-to-electrode capacitance is taken into account. However, this sensor has also a problem that, when the MOS transistor Sl is turned ON to discharge the signal charge of the capacity Cl, the capacities $C_2$ and $C_3$ are also discharged through a capacitance $C'$ between the electrodes, whereby crosstalk takes place in the signal charge.

SUMMARY OF THE INVENTION

It is an object of the present invention to provide a contact type image sensor which eliminates the need for such external circuits as a noise cancellation circuit and an amplifier circuit, generates no noise charges, is capable of generating a sufficiently large signal indicative of an original document image information, and prevents the occurrence of cross talk through capacitances between adjacent electrode.

In accordance with the present invention, in a contact type image sensor in which a photoconductive layer sandwiched between a first electrically conductive layer and a plurality of second separate electrodes to form a plurality of light receiving elements comprising a plurality of buffer amplifiers each connected to corresponding one of the plurality of light receiving elements for respectively outputting a voltage whose value corresponds to electric charge stored in the corresponding light receiving elements, switching means for gating the outputs of the buffer amplifiers, and control means for controlling the switching means to lead the outputs of the buffer amplifiers to a signal output line sequentially.

In the contact type image sensor of the present invention, a buffer amplifier is provided for each of the light receiving elements to output the charge of the each element in the form of a voltage, whereby spike noises generated by the switching circuits when they are turned on are eliminated.

In one modification of the present invention, the plurality of light receiving elements are divided into a plurality of blocks and only one of the blocks corresponding to the signal charge is connected to the signal output line, thereby reducing the load capacity of the circuit and enabling the high speed output of the voltage corresponding to the signal charge.

DESCRIPTION OF THE PREFERRED EMBODIMENT

An embodiment of the present invention will be detailed with reference to the accompanying drawings.

Figure 1:
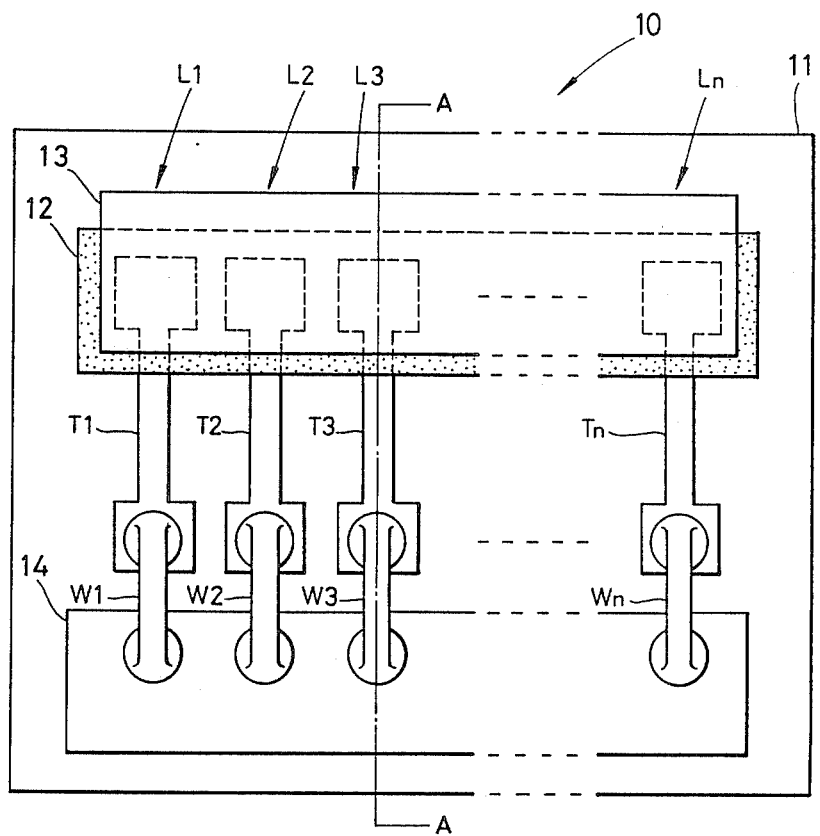
FIG. 1 is a plan view showing a featured part of a contact type image sensor.
Figure 2:
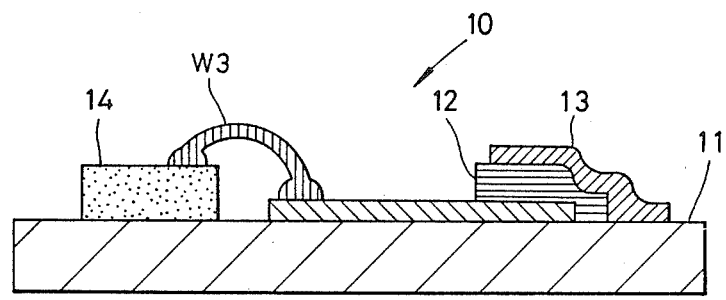
FIG. 2 is a cross-sectional view of the sensor taken along line A—A' in FIG. 1.
Figure 3:
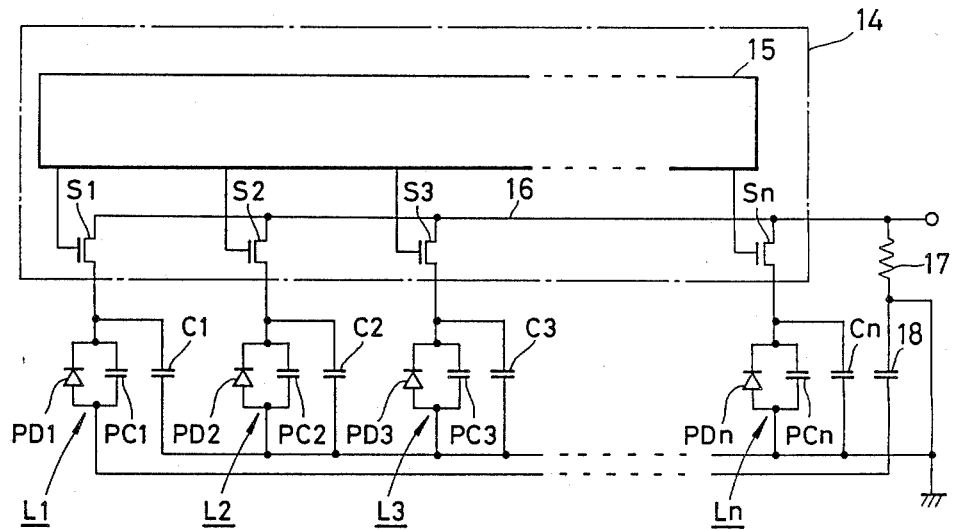
FIG. 3 is a circuit diagram of the contact type image sensor.
Figure 4:
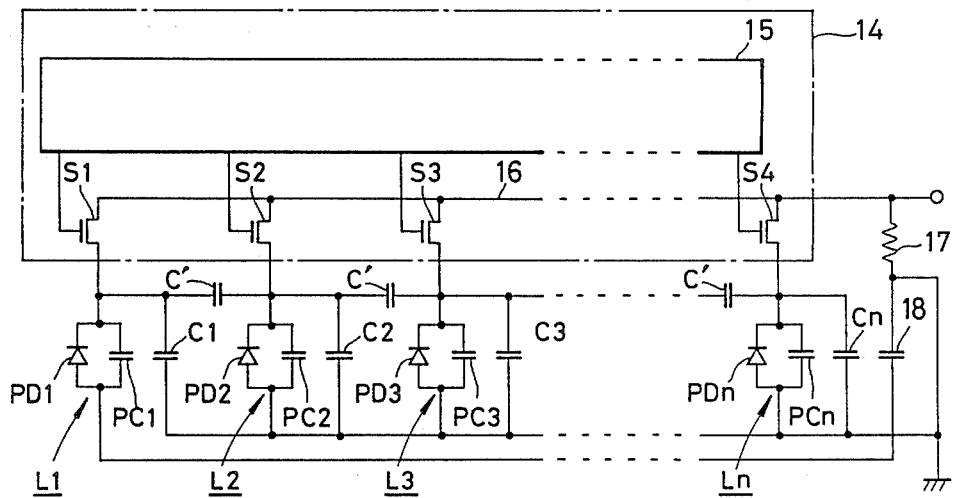
FIG. 4 is a circuit diagram of another contact type image sensor in which a capacitance between adjacent electrodes is taken into account.
Figure 5:
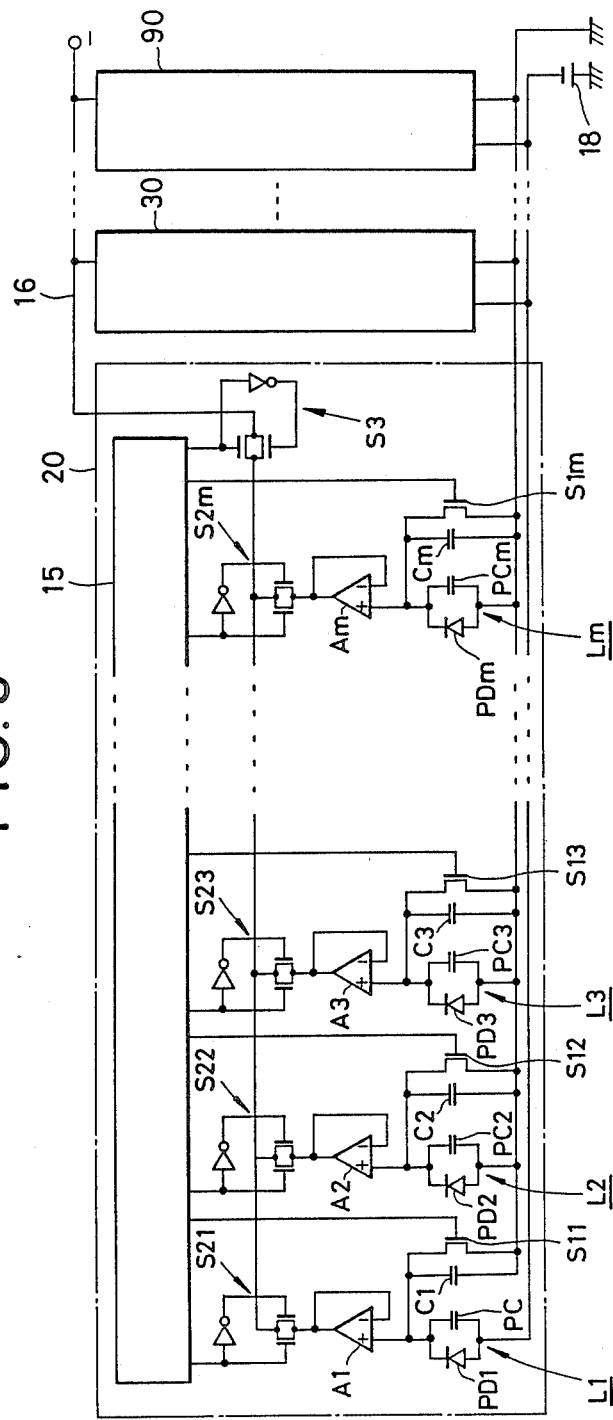
FIG. 5 is a circuit diagram of a contact type image sensor in accordance with the present invention.

FIG. 5 shows a circuit diagram of a contact type image sensor in accordance with the present invention, in which parts having substantially the same functions as those in FIG. 3 are denoted by the same reference numerals. The image sensor according to the present invention comprises a plurality of blocks 20, 30, . . . and 90 each of which includes light receiving elements L1 to Lm. The blocks have the same arrangement and thus explanation will be made as to only the block 20.

Capacities C1 to Cm for storing therein signal charges are respectively connected to first switching circuits S11 to S1m which discharge the signal charges in the associated capacities to reset the light receiving elements L1 to Lm. The elements L1 to Lm, which are equivalently expressed by parallel circuits of photodiodes PD1 to PDm and capacitors PC1 to PCm respectively, are connected at their one ends to a common minus terminal of a power source 18 and at the other ends to second switching circuits S21 to S2m through amplifiers A1 to Am, respectively. The light receiving elements L1 to Lm are also connected at the other ends to a signal output line 16 via the amplifiers A1 to Am and a common third switching circuit S3.

Figure 6:
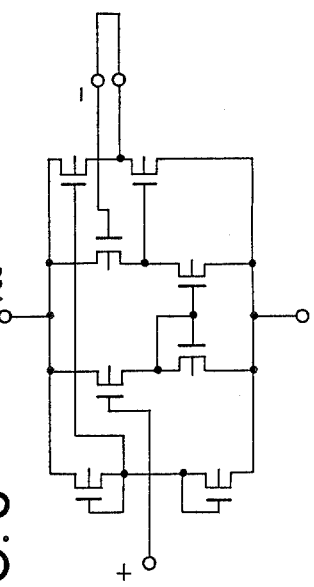
FIG. 6 is a circuit diagram of an amplifier used in FIG. 5.

The amplifiers A1 to Am each comprise such a voltage follower circuit as shown in FIG. 6. Since the follower circuit has a high input impedance and a low output impedance, the amplifiers A1 to Am can output a voltage substantially the same as the voltage applied to their noninvert input terminals + so that the signal charges of the capacities C1 to Cm will not be discharged but kept therein.

The first, second and third switching circuits S11 to S1m, S21 to S2m and S3 are controllably turned ON and OFF at a proper timings by a shift register 15. The switching circuits S21 to S2m and S3 respectively comprise a CMOS transistor (complementary MOS transistor) and on inverter, and function to prevent the generation of spike noises when they are turned ON and OFF and mixing of the spike noises with the signal charges of the capacitites C1 to Cm. More specifically, in each of the second and third switching circuits S21 to S2m and S3, an n-channel MOS transistor is connected to a p-channel MOS transistor so that the signal applied from the control circuit 15 will have mutually opposite polarities at gates of the p-and n-channel MOS transistors, whereby spike noises appearing on the signal output line 16 when the switching circuit is closed will be mutually cancelled and minimized. Further, the third switching circuit S3 is set to be closed only when the signal charges of the capacities C1 to Cm connected to the switching circuit S3 are outputted, and otherwise to be kept open, thereby realizing the high speed output of the signal charges. In other words, if all of the light receiving elements are connected in parallel with the signal output line 16 as in the above-mentioned contact, then the load capacity of the circuit will be to the sum of junction capacitances of the second switching circuits S21 to S2n, remarkably reducing the output speed of the signal charges. If the junction capacitances of the each second switching circuit is, for example, between around 10 and 100 pF, then the load capacity will be between arround 1000 and 10000 pF. To avoid this, in accordance with the present invention, the third switching circuit S3 is provided between the plurality of light receiving elements and the signal output line 16, and the switching circuit S3 is closed only when the signal charges of the elements L1 to Lm associated with the switching circuit S3 are output, whereby the load capacity at the time of at least signal charge output can be reduced and voltage whose value corresponds to the signal charges can be output at a high speed.

Next, explanation will be made as to the operation of the contact type image sensor according to the present invention. First, when an image of an original manuscript is optically formed on the light receiving elements L1 to Lm, light currents corresponding to the intensity of light received respectively at the elements L to Lm will flow through the photodiodes PD1 to PDm to store signal charges in the associated capacities C1 to Cm. At this time, output voltages of the amplifiers A1 to Am correspond is magnitude to the signal charges stored in the associated capacitors C1 to Cm. Then, the third switching circuit S3 is turned ON and the second switching circuits S21 to S2m are sequentially turned ON to thereby output on the signal output line 16 the output voltages of the amplifiers A1 to Am corresponding in magnitude to the signal charges of the capacities C1 to Cm. Further, the scanning by the second switching circuits S21 to S2m provides a proper time delay. More specifically, when the switching element S23 is turned ON, the switching scanning operation of the first switching circuits S11 to S1m will cause discharging the signal charges of the capacities C1 to Cm, thereby resetting the light receiving elements L1 to Lm.

The signal to noise (S/N) ratio of the contact type image sensor according to the present invention will now be calculated. Assume that the light current flowing through the light receiving element L1 under light illumination is 1 (mA) and the storage time of the capacity Cl is 1 (mn). Then the capacitor Cl having a capacitance of 1 (pF) will store a signal charge of 1 $pC$ ($=1$ ($mA$)$\times 1$ ($ms$)) and the amplifier Al will have an output voltage of 1 ($pC$)/1 ($pF$)$=1(V)$. Further, assume that the junction capacitance of the second switching circuit S21, that is, a difference between the junction capacitances of the n-channel and p-channel MOS transistors between their gate andf source is 0.1 ($pF$) and that the gate voltage is 5 ($V$). Then, the amount of noise charge caused by spike noise will be 0.5 ($pC$)($=0.1$ ($pF$)$\times 5$ ($V$)). When the capacitance of the output signal line 16 is 100 ($pF$), the amount of noise charge will correspond to 0.005($V$) ($=0.5$ ($pC$)/100 ($pF$)) and thus the S/N ratio of the signal charge will be 1/0.005$=$200 or 46 (dB). When the signal charges are output, that is, when the output voltages of the amplifiers Al to Am are output, the capacities Cl and Cm will not be charged nor discharged. As a result, any movement of charges between the adjacent light receiving elements through their electrode-to-electrode capacitance will not take place, resulting is no occurrence of any crosstalk.

What is claimed is:

1. A contact type image sensor comprising:
   (a) a plurality of light receiving elements for storing electric charges in response to light incident thereon, said light receiving elements being formed by a plurality of separate electrodes disposed on a substrate, a photoconductive layer, disposed over said separate electrodes, and a transparent electrically conductive layer disposed over said photoconductive layer;
   (b) a signal output line for outputting electric charges stored in said plurality of light receiving elements;
   (c) a plurality of first switching circuits each provided for a respective one of said plurality of light receiving elements, for discharging the electric charge stored in said light receiving elements;
   (d) a plurality of high input impedance amplifiers each provided for a respective one of said plurality of light receiving elements, having an output outputting a voltage corresponding to the amount of electric charge stored in said light receiving elements;
   (e) a plurality of second switching circuits each provided for a respective one of said plurality of light receiving elements and comprising complementary CMOS transistors, said CMOS Transistors having gates, and an inverter which is connected between said gates of said CMOS transistors for sequentially switching the output of said high input impedance amplifiers; and
   (f) a third switching circuit comprising a CMOS transistor and an inverter, and having an input terminal commonly connected to every output of said plurality of second switching circuits and an output terminal connected to said signal output line.

2. The contact type image sensor as set forth in claim 1, wherein said high input impedance amplifier comprises a voltage follower circuit comprising a complementary MOS differential transistor.

3. The contact type image sensor as set forth in claim 25, wherein said third switching circuits comprise complementary MOS analog switches whose gate electrodes are mutually connected via an invertor, voltage applied to gate electrodes in said second switching circuits during a switching operation having an opposite polarity and spike noise leaking into said signal output line from gate electrodes of said CMOS transistors being cancelled, whereby noise is minimized.

4. The contact type linear image sensor as set forth in claim 1, wherein said first switching circuits are turned on when the second switching means associated with the light receiving element arranged forwardly by one or more other light receiving elements is turned on.

5. The contact type linear image sensor as set forth in claim 1, further comprising control means for controlling said first, second and third switching circuits sequentially to lead said outputs of said second switching circuits to said output signal line, said control means comprising a shift register for providing said first, second and third switching means with a control signal.

* * * * *